United States Patent
Briano

(10) Patent No.: US 11,029,366 B2
(45) Date of Patent: Jun. 8, 2021

(54) GROUND DISCONNECT DETECTION FOR MULTIPLE VOLTAGE DOMAINS

(71) Applicant: Allegro MicroSystems, LLC, Manchester, NH (US)

(72) Inventor: Robert A. Briano, Auburn, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 197 days.

(21) Appl. No.: 16/539,405

(22) Filed: Aug. 13, 2019

(65) Prior Publication Data

US 2021/0048467 A1 Feb. 18, 2021

(51) Int. Cl.
*G01R 31/50* (2020.01)
*H02H 5/10* (2006.01)

(52) U.S. Cl.
CPC ............ *G01R 31/50* (2020.01); *H02H 5/105* (2013.01)

(58) Field of Classification Search
CPC ...... H02H 5/105; G01R 31/52; G01R 31/006; G01R 31/50
USPC ........................................ 324/509, 500, 512
See application file for complete search history.

(56) References Cited

U.S. PATENT DOCUMENTS

| | | | |
|---|---|---|---|
| 5,812,363 A | 9/1998 | Kuroda et al. | |
| 6,873,065 B2 | 3/2005 | Haigh et al. | |
| 8,169,108 B2 | 5/2012 | Dupuis et al. | |
| 8,643,138 B2 | 2/2014 | Dong | |
| 8,937,797 B2 | 1/2015 | Pirchio et al. | |
| 9,514,879 B2 | 12/2016 | Pagani | |
| 9,660,848 B2 | 5/2017 | Yun et al. | |
| 9,824,995 B2 * | 11/2017 | Viswanathan | .......... H01L 23/66 |
| 10,074,939 B1 | 9/2018 | Briano | |
| 2004/0189323 A1 | 9/2004 | Nagase | |
| 2006/0263727 A1 | 11/2006 | Lee et al. | |
| 2008/0158777 A1 | 7/2008 | Sohn et al. | |
| 2009/0278547 A1 | 11/2009 | Acena et al. | |
| 2010/0244849 A1 | 9/2010 | Yano et al. | |
| 2011/0148549 A1 | 6/2011 | Kanschat et al. | |
| 2012/0181874 A1 | 7/2012 | Willkofer et al. | |
| 2013/0229734 A1 | 9/2013 | Beck et al. | |

(Continued)

FOREIGN PATENT DOCUMENTS

DE 10 2013 100 622 A1 7/2014

OTHER PUBLICATIONS

European Intention to Grant dated Apr. 20, 2020 for European Application No. 18185696.4; 6 Pages.

(Continued)

*Primary Examiner* — Giovanni Astacio-Oquendo
(74) *Attorney, Agent, or Firm* — Daly Crowley Mofford & Durkee, LLP

(57) ABSTRACT

Methods and apparatus for an IC package having an impedance detector module configured to have: a first connection to a first external energy source via a first IO pin of the IC package and a second connection to a detection component. In embodiments, the detection component is configured for connection to a first ground for the first external energy source via a second IO pin of the IC package, and to a barrier component, which is configured for connection to a second ground for a second external energy source via a third IO pin of the IC package. The impedance detector module is configured to detect a disconnection or degradation of a connection to ground.

33 Claims, 9 Drawing Sheets

(56) References Cited

U.S. PATENT DOCUMENTS

| | | |
|---|---|---|
| 2013/0278077 A1 | 10/2013 | Mueck |
| 2013/0278372 A1 | 10/2013 | Stecher et al. |
| 2013/0300430 A1 | 11/2013 | Lindsay et al. |
| 2013/0335882 A1 | 12/2013 | Ma et al. |
| 2014/0049261 A1 | 2/2014 | Flack |
| 2014/0253225 A1 | 9/2014 | Lee et al. |
| 2014/0253227 A1 | 9/2014 | Yach et al. |
| 2015/0219706 A1 | 8/2015 | Loftus et al. |
| 2015/0233859 A1 | 8/2015 | Zhu et al. |
| 2016/0126367 A1 | 5/2016 | Dunton et al. |
| 2017/0250127 A1* | 8/2017 | Fernando .......... H01L 23/49513 |
| 2019/0371746 A1* | 12/2019 | Mahon .................. H03H 7/38 |

OTHER PUBLICATIONS

Extended European Search Report (EESR) dated Jan. 15, 2021 for European Application No. 20187369.2; 9 Pages.

U.S. Appl. No. 15/906,291, filed Feb. 27, 2018, Briano et al.

U.S. Appl. No. 16/547,823, filed Aug. 22, 2019, Briano et al.

Culurciello et al., "Monolithic Digital Galvanic Isolation Buffer Fabricated in Silicon on Sapphire CMOS;" Electronic Letters, vol. 41, No. 9; Apr. 28, 2005; 2 Pages.

Moghe et al., "Monolithic 2.5kV RMS, 1.8V-3.3V Dual Channel 640Mbps Digital Isolator in 0.5μm SOS;" Proceedings of the IEEE International SOI Conference; Oct. 1, 2012; 2 Pages.

European Examination Report dated Sep. 26, 2019 for European Application No. 18185696.4; 4 Pages.

U.S. Appl. No. 16/430,849, filed Jun. 4, 2019, Briano et al.

Akiyama et al., "A High-Voltage Monolithic Isolator for a Communication Network Interface;" IEEE Transactions on Electron Devices, vol. 49, No. 5; May 2002; 7 Pages.

Daughton, "Spin-Dependent Sensors;" Invited Paper; Proceedings of the IEEE, vol. 91, No. 5; May 2003; 6 Pages.

Knoedl, Jr. et al., "A Monolithic Signal Isolator;" Proceedings of the 4th Annual IEEE Applied Power Electronics Conference and Exposition; Mar. 13, 1989; pp. 165-170; 6 Pages.

U.S. Notice of Allowance dated Jun. 13, 2018 for U.S. Appl. No. 15/671,357; 12 Pages.

Extended European Search Report dated Jan. 4, 2019 for European Application No. 18185696.4; 5 Pages.

Response (with Amended Specification & Claims) to Extended European Search Report dated Jan. 4, 2019 for European Application No. 18185696.4; Response filed Jun. 4, 2019; 14 Pages.

Response (with Amended Claims) to European Examination Report dated Sep. 26, 2019 for European Application No. 18185696.4; Response filed Jan. 13, 2020; 7 Pages.

\* cited by examiner

GROUND DISCONNECT DETECTION FOR MULTIPLE VOLTAGE DOMAINS

BACKGROUND

As is known in the art, signal isolators can be used to transfer information across a barrier used to separate two or more voltage domains for safety or functional isolation. For example, capacitive coupling can be used to transfer information across a barrier. Optocouplers include a LED that emits light through an optically transparent insulating film and strikes a photo detector that generates a current flow that corresponds to the emitted light. RF carriers can also be used to transmit information across an isolation barrier.

SUMMARY

The present invention provides methods and apparatus for an integrated circuit to detect ground disconnection for multiple modules. For example, automotive systems may include electronic modules that are powered by separate batteries, such as nominal 12V and 48V batteries for mild-hybrid vehicles. In some systems, the ground terminals for each of the batteries must be only connected together external to the module(s). In some embodiments, two separate cables are connected to the chassis. If one of the grounds becomes disconnected, then the module may no longer work properly. In example embodiments, an integrated circuit is configured to detect disconnection from ground, such as by a capacitive circuit on the IC which has multiple voltage domains. In some embodiments, one side of respective detection capacitors are connected to the ground on each voltage domain. If one ground is disconnected, the impedance of the capacitive circuit changes which can used to detect the ground disconnection.

In embodiments, a circuit is formed on a single integrated circuit chip/die which has first and second voltage domains that are separated from each other by an isolation barrier. Spanning the barrier between the voltage domains is a barrier capacitor, which has one plate connected to a ground on a high voltage, e.g., 48V side, and the other plate connected to a detection node on a low voltage, e.g., 12V side. On the 12V side, the detection node can be formed from one plate of a detection capacitor and an impedance detector circuit. The other plate of the detection capacitor can be connected to the 12V ground. When the 12V ground and 48V ground are connected outside of the module, the detection capacitor and barrier capacitor are in parallel which has a given impedance value between the detection node and the connected grounds. If there is a ground disconnection, a change in the total detection and barrier capacitor impedance can be used to detect the ground disconnection. For example, if the 48V ground becomes disconnected, the detection capacitor and barrier capacitor are no longer connected in parallel and the impedance from the detection node to the 12V ground changes. The change in impedance can be detected by the impedance detection circuit.

In one aspect, an IC package comprises: an impedance detector module configured to have: a first connection to a first external energy source via a first IO pin of the IC package; a second connection to a detection component, which is configured for connection to a first ground for the first external energy source via a second IO pin of the IC package, and to a barrier component, which is configured for connection to a second ground for a second external energy source via a third IO pin of the IC package.

An IC package can further include one or more of the following features: a fourth IO pin configured for connection to the second external energy source, the impedance detector module includes a threshold detector for detecting a level on the second connection that is above or below a given threshold due to a disconnection in continuity of a path to the second ground, the level corresponds to a current level, the impedance detector module is configured to inject a signal into the detection component and the barrier component, the detection component and the barrier component are connected in parallel, the injected signal has a frequency corresponding to impedances of the detection and barrier capacitances, the IC package includes a first die portion for a first voltage domain and a second die portion for a second voltage domain, wherein the first die portion and the second die portion are electrically isolated from each other, the first and second die portions are part of a single die separated by an etched trench filled with an insulating material, the first die portion is configured for connection to the first external energy source and the second die portion is configured for connection to the second energy source, the first and second die portions are between upper and lower dielectric layers, the barrier component comprises a barrier component having a first plate in the first voltage domain and a second plate in the second voltage domain, the IC package includes a first die portion for a first voltage domain and a second die portion for a second voltage domain, wherein the first die portion and the second die portion are electrically isolated from each other, and wherein the upper dielectric layer comprises an intermetallic dielectric (IMD) layer, and/or the first external energy source comprises a 12V battery and the second external energy source comprises a 48V battery.

In another aspect, a method comprises: for an IC package, employing: an impedance detector module configured to have: a first connection to a first external energy source via a first IO pin of the IC package; a second connection to a detection component, which is configured for connection to a first ground for the first external energy source via a second IO pin of the IC package, and to a barrier component, which is configured for connection to a second ground for a second external energy source via a third IO pin of the IC package.

A method can further include one or more of the following features: a fourth IO pin configured for connection to the second external energy source, the impedance detector module includes a threshold detector for detecting a level on the second connection that is above or below a given threshold due to a disconnection in continuity of a path to the second ground, the level corresponds to a current level, the impedance detector module is configured to inject a signal into the detection component and the barrier component, the detection component and the barrier component are connected in parallel, the injected signal has a frequency corresponding to impedances of the detection and barrier capacitances, the IC package includes a first die portion for a first voltage domain and a second die portion for a second voltage domain, wherein the first die portion and the second die portion are electrically isolated from each other, the first and second die portions are part of a single die separated by an etched trench filled with an insulating material, the first die portion is configured for connection to the first external energy source and the second die portion is configured for connection to the second energy source, the first and second die portions are between upper and lower dielectric layers, the barrier component comprises a barrier component having a first plate in the first voltage domain and a second plate in the second voltage domain, the IC package includes a first die portion for a first voltage domain and a second die portion for a second voltage domain, wherein the first die portion and the second die portion are electrically isolated from each other, and wherein the upper dielectric layer comprises an intermetallic dielectric (IMD) layer, and/or the first external energy source comprises a 12V battery and the second external energy source comprises a 48V battery.

In another aspect, an IC package comprises: an impedance detector means for connecting to a first external energy source via a first IO pin of the IC package and for connection to a detection component, which is configured for connection to a first ground for the first external energy source via a second IO pin of the IC package, and to a barrier component, which is configured for connection to a second ground for a second external energy source via a third IO pin of the IC package; and a fourth IO pin configured for connection to the second external energy source, wherein the impedance detector means includes a threshold detector for detecting a level on the second connection that is above or below a given threshold due to a disconnection in continuity of a path to the second ground.

BRIEF DESCRIPTION OF THE DRAWINGS

The foregoing features of this invention, as well as the invention itself, may be more fully understood from the following description of the drawings in which.

DETAILED DESCRIPTION

Figure 1:
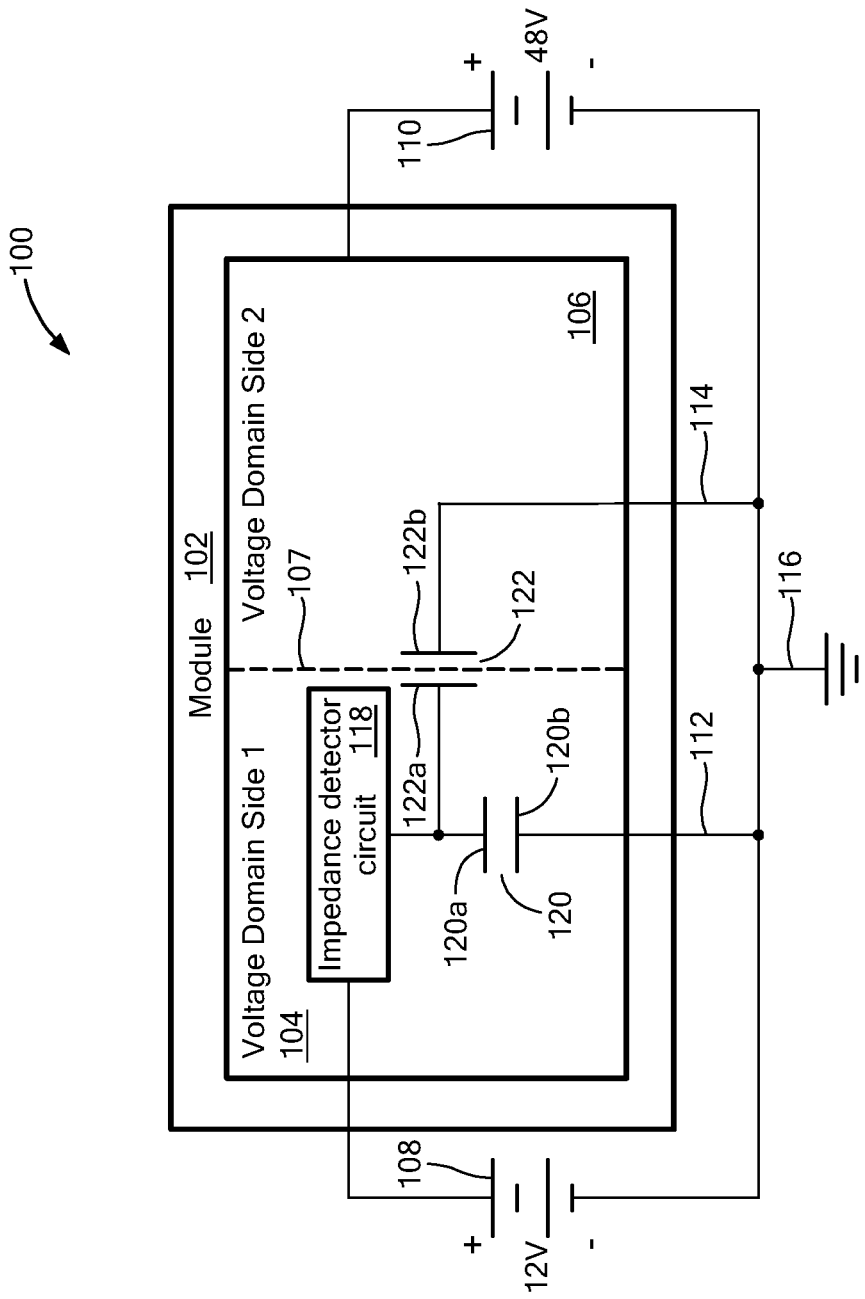
FIG. 1 is a schematic representation of a system including an IC package for detecting ground disconnections in accordance with example embodiments of the invention.

FIG. 1 shows an example ground disconnection system 100 that can be implemented in an integrated circuit in accordance with example embodiments of the invention. A module 102 containing circuitry can include a first voltage domain module 104 and a second voltage domain module 106. In embodiments, the first voltage domain module 104 operates at a first voltage level, such as 12V, and the second voltage domain module 106 operates at a second voltage level, such as 48V. An isolation barrier 107, which can be provided as a dielectric material, electrically isolates the first and second voltage domains 104, 106 from each other. A first battery 108, which is shown as 12V, is connected to the first voltage domain module 104, and a second battery 110, which is shown as 48V, is coupled to the second voltage domain module 106.

It is understood that the voltage domains can operate at any practical voltage with separate grounds. Voltage levels of 12V and 48V are merely illustrative. It should be noted that certain automotive applications, including some hybrid vehicles, operate at 12V and 48V.

In embodiments, a first ground 112 is connected to the first voltage domain module 104 and a second ground 114 is coupled to the second voltage domain module 106. The first and second grounds 112, 114 are coupled to a third ground 116. In example embodiments, the third ground 116 comprises chassis ground. That is, the third ground 116 is provided by a chassis of a vehicle. It is understood that the third ground 116 can be provided by any conductive structure that provides a suitable ground for the intended application.

In one embodiment, the first voltage domain module 104 includes an impedance detector module 118 configured to detect a disconnection of the first ground 112 connected to the first voltage domain module 104 and/or the second ground 114 connected to the second voltage domain module 106. A detection component 120, which can comprise a capacitor, is coupled between the impedance detector module 118 and the first ground 112. A barrier component 122, which can comprise a capacitor, is coupled between the first voltage domain module 104 and the second voltage domain module 106. In one particular embodiment, the barrier component 122 includes a capacitor having one plate 122a located in the first voltage domain module 104 coupled to the impedance detector module 118, and the other plate 122b located in the second domain module 106 coupled to the second ground 114. The detection capacitor 120 has first and second plates 120a,b separated by a dielectric material.

In the illustrated embodiment, the detection component 120 and barrier component 122 are coupled in parallel with respect to chassis ground 116. In the event of a disconnection or connection degradation, e.g., rust, dirt, etc., of the first ground 112 connected to the first voltage domain module 104 and/or the second ground 114 connected to the second voltage domain module, the total impedance seen by the impedance detection module 118 will change. In example embodiments, the total impedance seen by the impedance detection module 118 will increase due to a disconnection.

Figure 2:
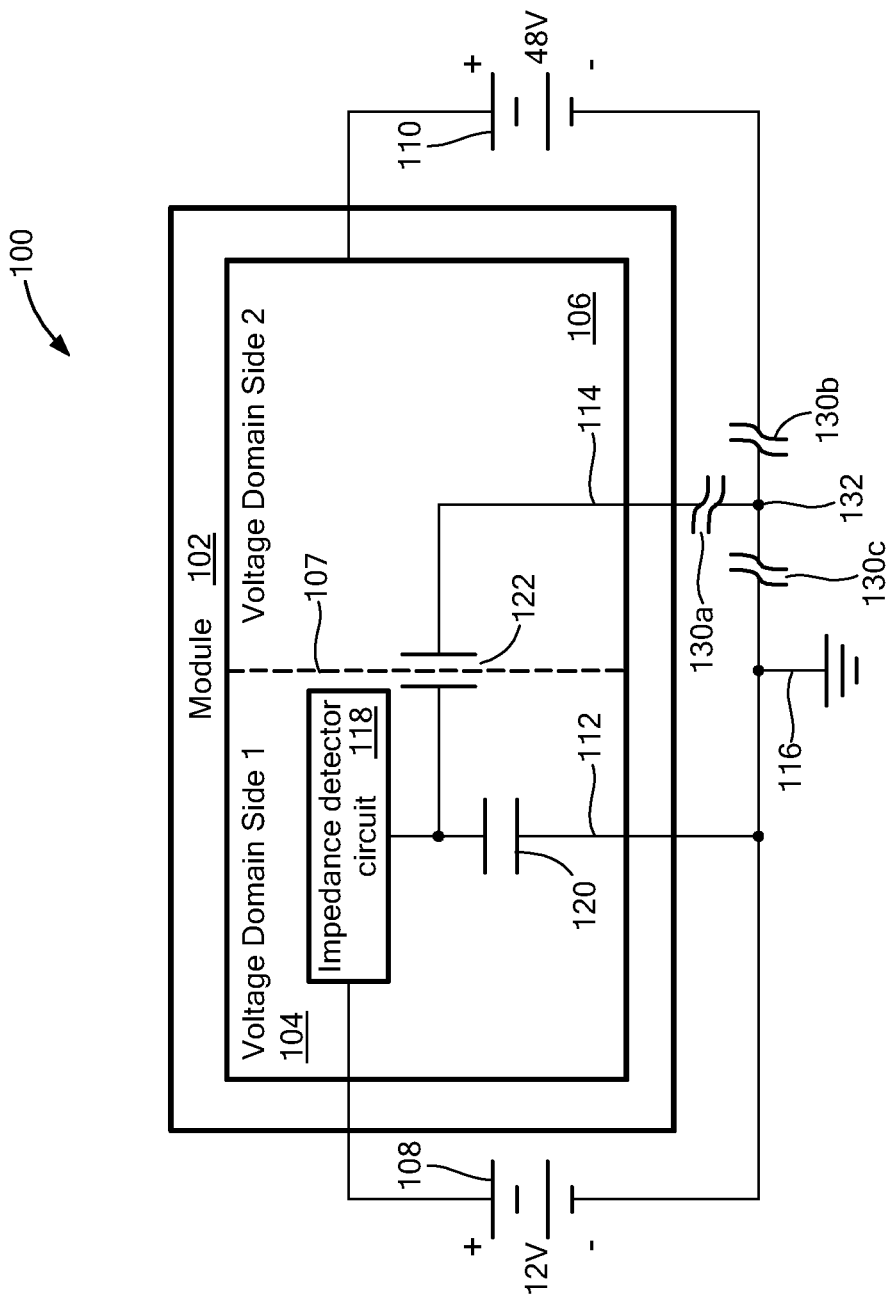
FIG. 2 is a schematic representation of the system of FIG. 1 with example ground disconnections.

FIG. 2 shows the system 100 of FIG. 1 with possible disconnection locations 130a,b,c of the second ground 114 from chassis ground 116. A first node 132 can be considered to be located at a point connecting the second voltage domain module 106, the negative terminal of the second battery 110, and the third (e.g., chassis) ground 116. The first disconnection location 130a is between the first node 132 and the barrier component 122 in the second voltage domain module 106. The second disconnection location 130b is between the first node 132 and the negative terminal of the second battery 110. The third disconnection location 130c is between the first node 132 and the third ground 116. It understood that similar disconnection locations can occur for the first ground 112.

Any disconnect or degradation at the disconnect locations 130a,b,c will change the impedance seen by the impedance detector module 118. In example embodiments, a disconnect detection signal having selected characteristics, such as frequency and amplitude, can be injected into the circuit and the total impedance of the detection component 120 and barrier component 122 analyzed. In embodiments, a current level seen by the impedance detector module 118 can be monitored. In the event of a current threshold event, an alert can be generated on an I/O pin indicative of a ground disconnect detection. In one embodiment, a sine wave is injected into the first and second voltage domains 104, 106. In embodiments, the impedance detector module 118 is connected to a positive terminal of one of the batteries and connected to the first and second batteries external to the impedance detector module. In example embodiments, the impedance detector module 118 injects a signal into the detection and barrier capacitors 120, 122. The portion of the injected signal in each of the capacitors depends on the relative impedance values of the capacitors.

It should be noted that the impedance detector module 118 can be located in either of the first and second voltage domain modules 104, 106 with a connection to corresponding one of the batteries 108, 110. For example, an impedance detector located in the first voltage domain will be connected to the external battery source connected to the first voltage domain.

Figure 3:
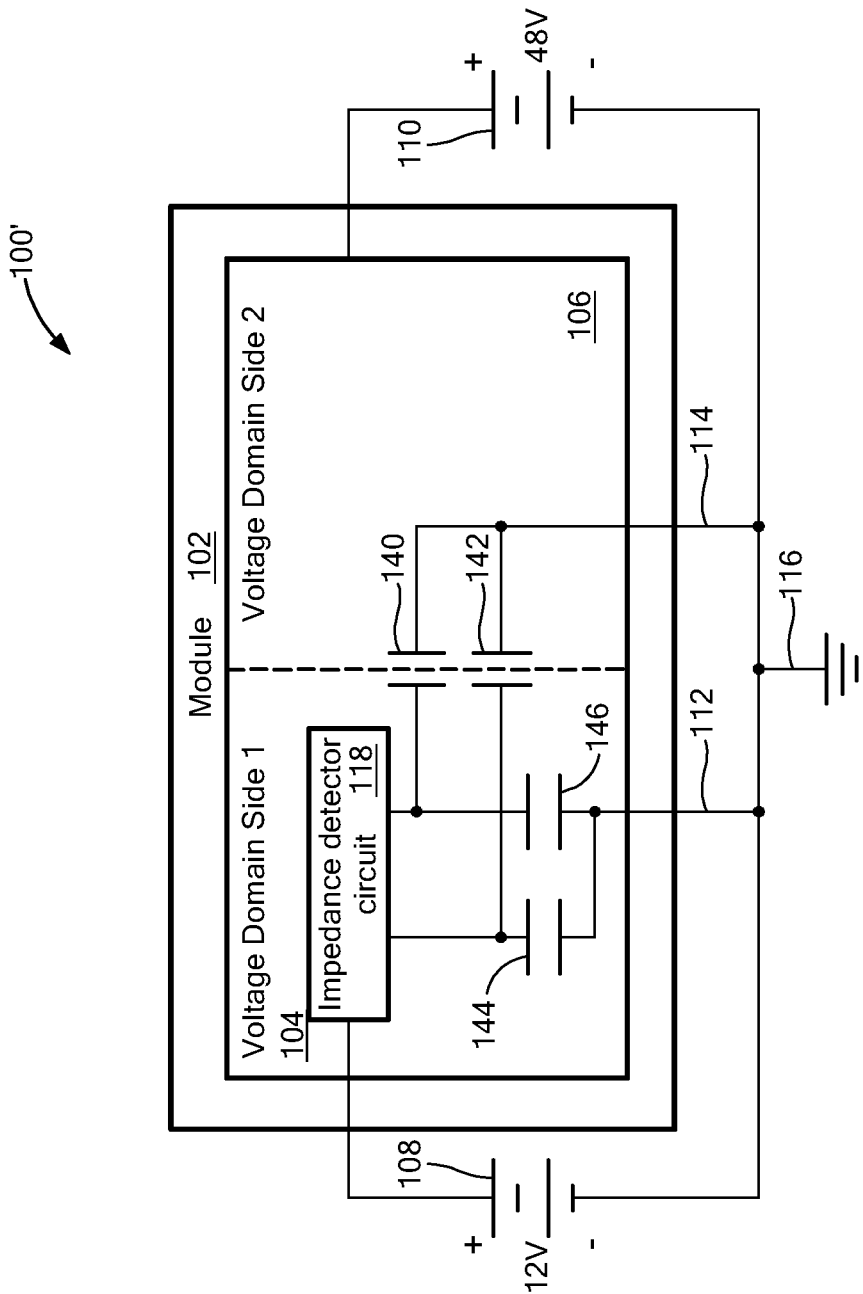
FIG. 3 is a schematic representation of an IC package having first and second voltage domains and an impedance detector module for a differential capacitive detection.

FIG. 3 shows an alternative circuit implementation for a ground disconnection detection system in which like reference numbers indicated like elements. In in the illustrated embodiment, first and second barrier capacitors 140, 142 each have a first terminal in the first voltage domain module 104 and a second terminal in the second voltage domain module 106 coupled to the second ground 114. First and second detection capacitors 144, 146 have respective first terminals separately coupled to the impedance detector module 118 and second terminals coupled to the first ground 112. The first terminal of the first barrier capacitor 140 is coupled to the first terminal of the second detection capacitor 146 and the first terminal of the second barrier capacitor 142 is coupled to the first terminal of the first detection capacitor 144. It is understood that the configuration of FIG. 3 injects a differential signal to minimize the effects of common-mode noise on the ground.

In one aspect, the illustrative circuit of FIG. 1 can be implemented on an integrated circuit using silicon-in-insulator (SOI) processing, for example. A SOI wafer contains a handle (base silicon), a buried oxide (BOX), and a device layer above the buried oxide. The device layer can be separated into a 12V side and a 48V side by a deep trench, that is etched down to and is connected to the buried oxide, and filled with SiO2, for example. The impedance detection circuit can be formed in the 12V device layer (e.g., first voltage domain), for example. Capacitor plates can be fabricated using various metal layers of the integrated circuit and metal interconnects. The dielectric of the capacitors can comprise inter-metal dielectric material, e.g., SiO2. To create vertical capacitors, the plates can be made from metal layers that overlap. For example, the top plate of the barrier capacitor may span the trench from the detection node through a dielectric to a lower plate on the 48V side, which is connected to the 48V ground. The detection capacitor can have one plate connected to the detection node and the other plate connected to the 12V ground. In alternative structures, such as for the barrier capacitor, metal plates on the same layer can be used to create a horizontal capacitor. It is understood that other combinations of metal layers can be used to create horizontal and/or vertical detection capacitors or barrier capacitors. One or more of the capacitor plates can be formed by using conductive polysilicon for either or both capacitors.

Figure 4A:
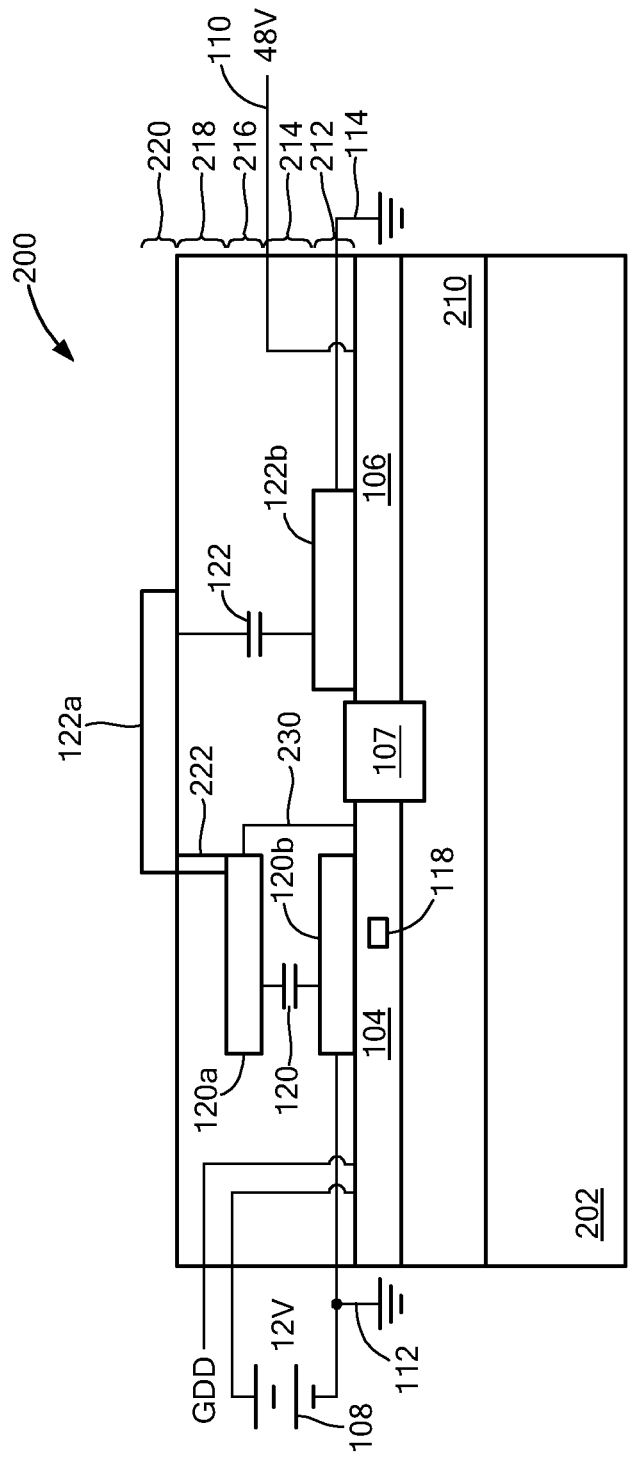
FIG. 4A is a cross-sectional view showing layers of an IC package for detecting ground disconnections.
Figure 4B:
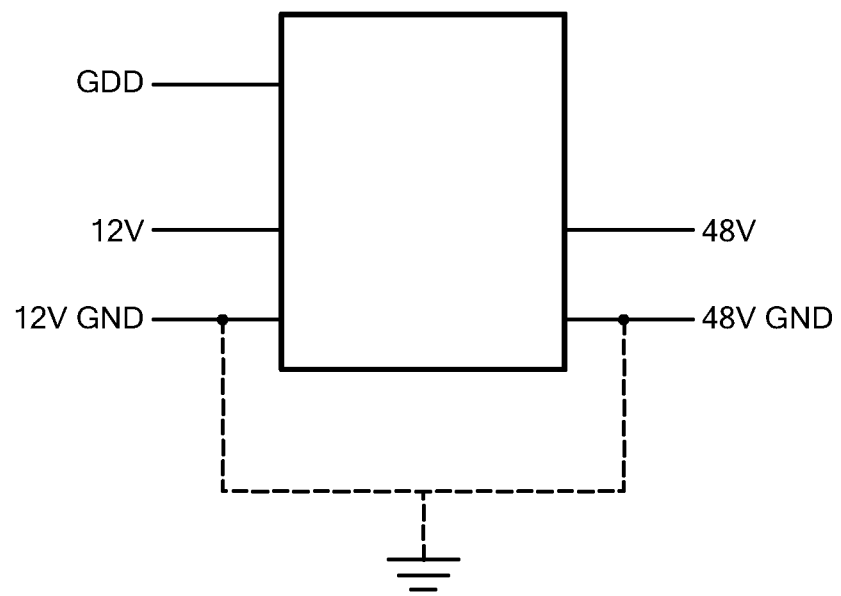
FIG. 4B shows an example pinout diagram for an IC package for detecting ground disconnections.

FIGS. 4A and 4B show an example integrated circuit package implementation of the system 100 of FIG. 1 in which like reference numbers indicate like elements. A silicon substrate 200 includes a handle 202 having a first device layer 104, which can correspond to the first voltage domain of FIG. 1, and a second device layer 106, which can correspond to the second voltage domain of FIG. 1, separated from each other by a trench 107 filled with a dielectric material, such as SiO2. A layer 210 of insulating material, such as buried oxide known as BOX, is between the first and second device layers 104, 106 and the handle 202. As is known in the art, circuitry is formed in the device layers of the substrate.

In embodiment, the first and second device layers 104, 106 are formed from a single die. In other embodiments, first and second die are used with wirebonds between the first and second die to connect the plates of the barrier capacitor.

A first metal layer 212 can be formed on the substrate and processed, e.g., etched, to form the second plate 120b of the detection capacitor 120 and the second plate 122b of the barrier capacitor 122. In embodiments, the second plate 122b of the barrier capacitor and the second plate 122b of the detection capacitor are not connected to the respective device layers 104, 106. An inter-metal dielectric (IMD) layer 214 can be formed over the first metal layer 212. It is understood that IMD layers can be formed by one of more applied layers of an insulator, such as SiO2, or other suitable materials/processes.

A second metal layer 216 can be formed and processed to provide the first plate 120a of the detection capacitor. A further IMD layer 218 can be formed on the second metal layer 216 and a third metal layer 220 can be formed to provide the first plate 122a of the barrier capacitor 122. As can be seen, a conductive material 222 can electrically connect the first plates 120a, 122a of the detection and barrier capacitors. It is understood that the detection capacitor 120 shown in FIG. 4A represents the capacitor formed by plates 120a, 120b in the respective metal layers and that the barrier capacitor 122 shown represents the capacitor formed by plates 122a, 122b. The insulative material, such as SiO2, between the first plates 122a, 120a and second plates 120b, 122b, can correspond to the barrier 107 of FIG. 1.

The first ground 112, shown as a 12V ground is coupled to the second plate 120b of the detection capacitor 120 and the second ground, shown as a 48V ground, is coupled to the second plate 122b of the detection capacitor. A 12V battery 108 can be coupled to the first device layer 104 and a 48V battery 110 can be coupled to the second device layer 106.

In embodiments, the impedance detection module 118 can be formed in the first device layer 104 and connected 230 to the first plate 120a of the detection capacitor 120. As described above, the impedance detection module 118 can generate an injection signal and measure signal levels, e.g., current, corresponding to the total impedance of the detection and barrier capacitors 120, 122 for detecting a ground disconnection. In the event a ground disconnection is detected, the impedance detection module 118 can make active a ground disconnect detection (GGD) signal.

A variety of electrical configurations can be implemented in alternative IC packages. In addition, a variety of circuit components, such as capacitors, inductors, resistors, etc., can be used in a range of circuit implementations to meet the needs of a particular application, such as providing a given circuit with desired impedance characteristics to enhance ground disconnect detection.

Figure 5A:
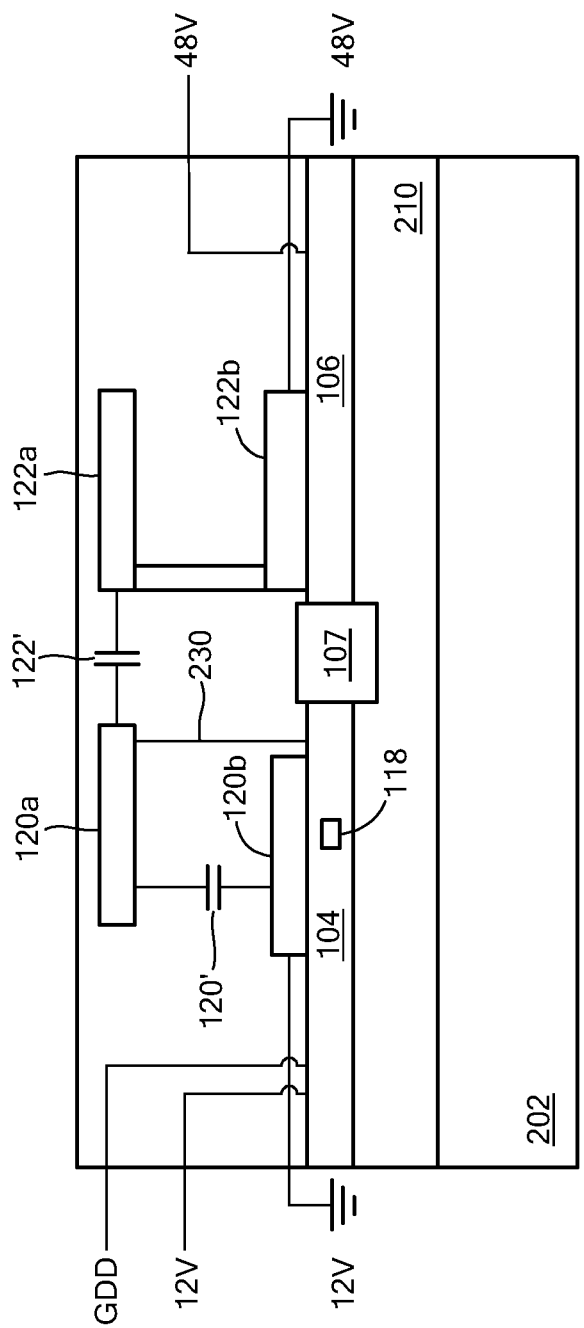
FIG. 5A is a cross-sectional view showing layers of a further IC package for detecting ground disconnections.

FIG. 5A shows an alternative implementation of a ground disconnect detection IC in which common reference numbers indicate like elements. In this embodiment, the barrier capacitor 122' is capacitively coupled in a horizontal configuration.

Figure 5B:
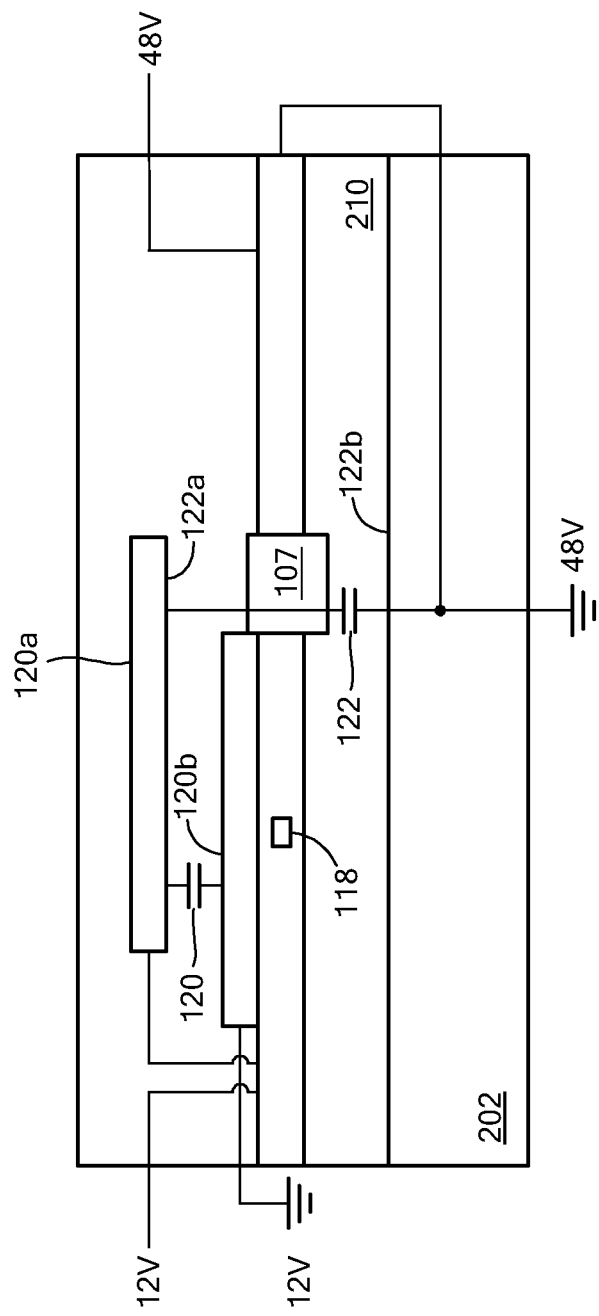
FIG. 5B is a cross-sectional view showing layers of a further IC package for detecting ground disconnections.

FIG. 5B shows a further implementation of a ground disconnect detection IC in which common reference numbers indicate like elements. The first plate 120a of the detection capacitor 120 overlaps with the second plate 120b of the detection capacitor, which is coupled to 12V ground, as well as a portion of the bulk substrate 202, which forms the second plate 122b of the barrier capacitor 122. The dielectric material, including the trench material 107 and IMD layers between the bulk substrate 210 and the first plate 122a provides the dielectric for the barrier capacitor 122.

When ground is disconnected, the change in impedance causes current through the disconnect and barrier capacitors 120, 122 to change when the injected signal is from a voltage source. If the injected signal is from a current source, then the voltages across the capacitors change.

It is understood that any suitable wafer material and processing techniques can be used in alternative embodiments.

Figure 6:
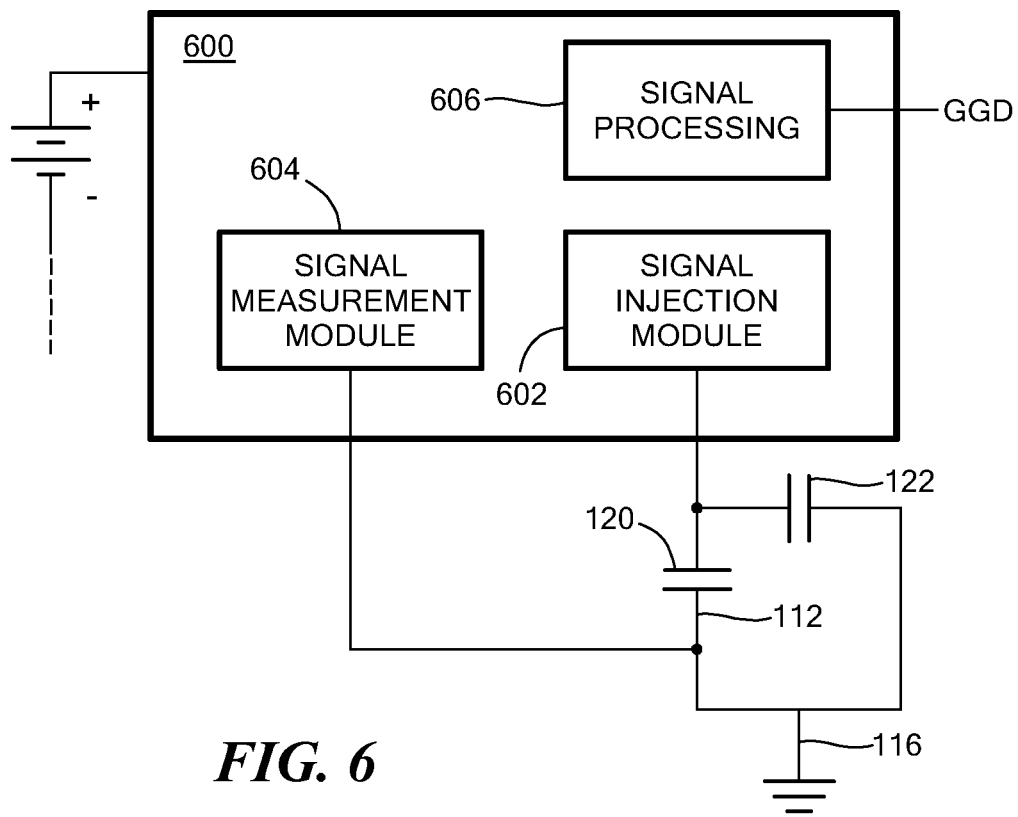
FIG. 6 is a schematic representation of a portion of a ground disconnection detection system including an impedance detector module.

FIG. 6 is a schematic representation of an example impedance detector module 600, such as the impedance detector module 118 of FIG. 1. The impedance detector module 600 is connected to the detection capacitor 120 and the barrier capacitor 122, as described above. A signal injection module 602 is configured to inject a signal into the detection capacitor 120 and the barrier capacitor 122. A change in impedance due to a ground disconnect or connection degradation will change the signal through the detection capacitor 120 and the barrier capacitor 122. A signal measurement module 604 can measure a current and/or voltage of a signal at a node between the detection capacitor 120 and the first ground 112, for example. As noted above, when ground is disconnected, the change in impedance causes current through the disconnect and barrier capacitors 120, 122 to change when the injected signal from the signal injection module 602 is from a voltage source. A signal processing module 606 can receive information from the signal measurement module 604. If the injected signal from the signal injection module 602 is from a current source, then the voltages across the capacitors change. If the signal is above a current and/or voltage threshold, then the signal processing module 606 can activate the GDD (ground disconnect detection) signal.

Figure 6A:
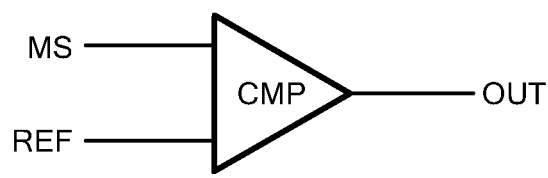
FIG. 6A is an example comparison circuit for comparing a measured signal with a reference signal.
Figure 6B:
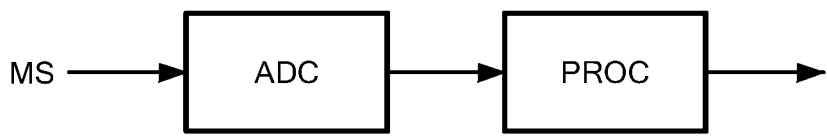
FIG. 6B is an example circuit for digitizing a measured signal for comparison with a threshold.

It is understood that any suitable circuitry can be used to detect a signal that exceeds/falls below a given threshold including sense resistors, comparators, analog-to-digital conversion, in an analog and/or digital domain. In embodiments, at least a portion of the circuitry for the impedance detection module 118/600 can be formed in an active layer of a die, such as the first and/or second device layers 104,106 described above. FIG. 6A shows an example of a measured signal MS in the signal measurement module 604 input to a comparator CMP or amplifier to generate an output signal. The measured signal MS is compared against a reference signal REF which corresponds to the threshold level to determine whether a GGD signal should be active. FIG. 6 shows a measured signal MS digitized by an analog-to-digital (ADC) for processing by a digital processor PROC.

Figure 7:
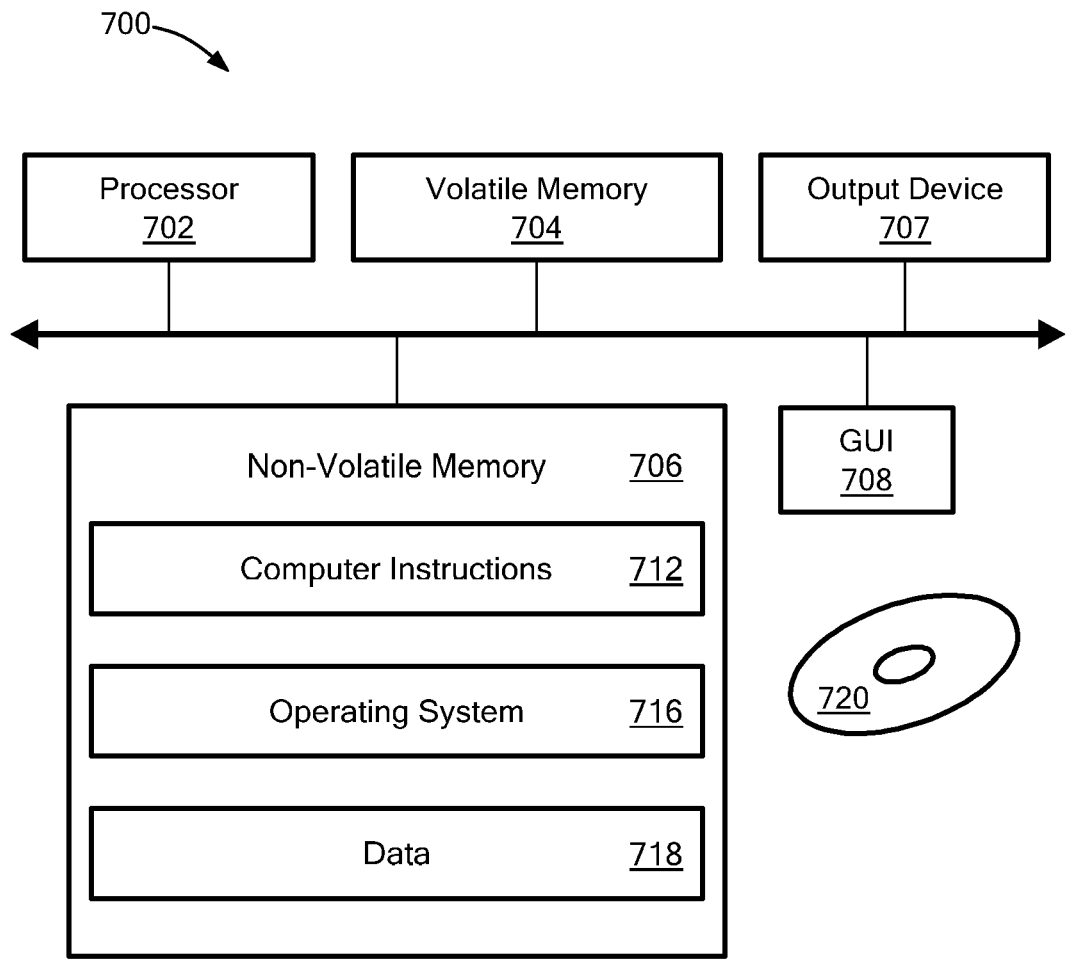
FIG. 7 is a schematic representation of an example computer that can perform at least a portion of the processing described herein.

FIG. 7 shows an exemplary computer 700 that can perform at least part of the processing described herein, such as analyzing a measured signal during signal injection, as described above, to detect a ground disconnection. The computer 700 includes a processor 702, a volatile memory 704, a non-volatile memory 706 (e.g., hard disk), an output device 707 and a graphical user interface (GUI) 708 (e.g., a mouse, a keyboard, a display, for example). The non-volatile memory 706 stores computer instructions 712, an operating system 716 and data 718. In one example, the computer instructions 712 are executed by the processor 702 out of volatile memory 704. In one embodiment, an article 720 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high-level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. An IC package, comprising:
   an impedance detector module configured to have:
   a first connection to a first external energy source via a first IO pin of the IC package;
   a second connection to a detection component, which is configured for connection to a first ground for the first external energy source via a second IO pin of the IC package, and to a barrier component, which is configured for connection to a second ground for a second external energy source via a third IO pin of the IC package.

2. The IC package according to claim 1, wherein the IC package includes a fourth IO pin configured for connection to the second external energy source.

3. The IC package according to claim 1, wherein the impedance detector module includes a threshold detector for detecting a level on the second connection that is above or below a given threshold due to a disconnection in continuity of a path to the second ground.

4. The IC package according to claim 1, wherein the level corresponds to a current level.

5. The IC package according to claim 1, wherein the impedance detector module is configured to inject a signal into the detection component and the barrier component.

6. The IC package according to claim 5, wherein the detection component and the barrier component are connected in parallel.

7. The IC package according to claim 5, wherein the injected signal has a frequency corresponding to impedances of the detection and barrier capacitances.

8. The IC package according to claim 1, wherein the IC package includes a first die portion for a first voltage domain and a second die portion for a second voltage domain, wherein the first die portion and the second die portion are electrically isolated from each other.

9. The IC package according to claim 8, wherein the first and second die portions are part of a single die separated by an etched trench filled with an insulating material.

10. The IC package according to claim 8, wherein the first die portion is configured for connection to the first external energy source and the second die portion is configured for connection to the second energy source.

11. The IC package according to claim 8, wherein the first and second die portions are between upper and lower dielectric layers.

12. The IC package according to claim 8, wherein the barrier component comprises a barrier component having a first plate in the first voltage domain and a second plate in the second voltage domain.

13. The IC package according to claim 1, wherein the IC package includes a first die portion for a first voltage domain and a second die portion for a second voltage domain, wherein the first die portion and the second die portion are electrically isolated from each other, and wherein the upper dielectric layer comprises an intermetallic dielectric (IMD) layer.

14. The IC package according to claim 1, wherein the first external energy source comprises a 12V battery and the second external energy source comprises a 48V battery.

15. A method, comprising:
for an IC package, employing:
an impedance detector module configured to have:
  a first connection to a first external energy source via a first IO pin of the IC package;
  a second connection to a detection component, which is configured for connection to a first ground for the first external energy source via a second IO pin of the IC package, and to a barrier component, which is configured for connection to a second ground for a second external energy source via a third IO pin of the IC package.

16. The method according to claim 15, wherein the IC package includes a fourth IO pin configured for connection to the second external energy source.

17. The method according to claim 15, wherein the impedance detector module includes a threshold detector for detecting a level on the second connection that is above or below a given threshold due to a disconnection in continuity of a path to the second ground.

18. The method according to claim 15, wherein the level corresponds to a current level.

19. The method according to claim 15, wherein the impedance detector module is configured to inject a signal into the detection component and the barrier component.

20. The method according to claim 19, wherein the detection component and the barrier component are connected in parallel.

21. The method according to claim 19, wherein the injected signal has a frequency corresponding to impedances of the detection and barrier capacitances.

22. The method according to claim 15, wherein the IC package includes a first die portion for a first voltage domain and a second die portion for a second voltage domain, wherein the first die portion and the second die portion are electrically isolated from each other.

23. The method according to claim 22, wherein the first and second die portions are part of a single die separated by an etched trench filled with an insulating material.

24. The method according to claim 22, wherein the first die portion is configured for connection to the first external energy source and the second die portion is configured for connection to the second energy source.

25. The method according to claim 22, wherein the first and second die portions are between upper and lower dielectric layers.

26. The method according to claim 22, wherein the barrier component comprises a barrier component having a first plate in the first voltage domain and a second plate in the second voltage domain.

27. The method according to claim 15, wherein the IC package includes a first die portion for a first voltage domain and a second die portion for a second voltage domain, wherein the first die portion and the second die portion are electrically isolated from each other, and wherein the upper dielectric layer comprises an intermetallic dielectric (IMD) layer.

28. The method according to claim 15, wherein the first external energy source comprises a 12V battery and the second external energy source comprises a 48V battery.

29. An IC package, comprising:
an impedance detector means for connecting to a first external energy source via a first IO pin of the IC package and for connection to a detection component, which is configured for connection to a first ground for the first external energy source via a second IO pin of the IC package, and to a barrier component, which is configured for connection to a second ground for a second external energy source via a third IO pin of the IC package; and
a fourth IO pin configured for connection to the second external energy source,
wherein the impedance detector means includes a threshold detector for detecting a level on the second connection that is above or below a given threshold due to a disconnection in continuity of a path to the second ground.

30. The IC package according to claim 29, wherein the impedance detector means includes a signal injector for injecting a signal into the detection component and the barrier component.

31. The IC package according to claim 29, wherein the IC package includes a first die portion for a first voltage domain and a second die portion for a second voltage domain, wherein the first die portion and the second die portion are electrically isolated from each other.

32. The IC package according to claim 31, wherein the first die portion is configured for connection to the first external energy source and the second die portion is configured for connection to the second energy source.

33. The IC package according to claim 32, wherein the barrier component comprises a barrier component having a first plate in the first voltage domain and a second plate in the second voltage domain.

* * * * *